(12) United States Patent
Suzuki (10) Patent No.: US 6,960,949 B2
(45) Date of Patent: *Nov. 1, 2005

(54) CHARGE PUMP CIRCUIT AND PLL CIRCUIT USING SAME

(75) Inventor: Norihito Suzuki, Kanagawa (JP)

(73) Assignee: Sony Corporation, (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/085,537

(22) Filed: Mar. 22, 2005

(65) Prior Publication Data

US 2005/0162201 A1 Jul. 28, 2005

Related U.S. Application Data

(63) Continuation of application No. 10/739,109, filed on Dec. 19, 2003.

(30) Foreign Application Priority Data

Dec. 26, 2002 (JP) .......................... P2002-376520

(51) Int. Cl.$^7$ ................................ H03L 7/06
(52) U.S. Cl. ............... 327/157; 327/536; 327/537; 363/59; 363/60
(58) Field of Search ................ 327/157, 159, 327/160, 383, 399, 424, 436, 437, 536, 537; 307/110; 363/59, 60

(56) References Cited

U.S. PATENT DOCUMENTS 5,825,640 A 10/1998 Quigley et al.
6,441,660 B1 * 8/2002 Ingino, Jr. .................. 327/156
6,456,513 B2 * 9/2002 Saito ........................... 363/59

FOREIGN PATENT DOCUMENTS

| EP | 1 037 366 A | 9/2000 |
|---|---|---|
| JP | 2000-269808 | 9/2000 |
| JP | 2000-177400 | 6/2001 |

OTHER PUBLICATIONS

A PLL Clock Generator with 5 to 110 MHz of Lock Range for Microprocessors, IEEE Journal of Solid-State Circuits, vol. 127, No. 11, Nov. 1992, pp. 1599-1607.
EPO Search Report Mar. 29, 2004.

* cited by examiner

Primary Examiner—Kenneth B. Wells
Assistant Examiner—An T. Luu
(74) Attorney, Agent, or Firm—Rader, Fishman & Grauer PLLC; Ronald P. Kananen (57) ABSTRACT

A charge pump circuit able to enhance the rising and falling characteristics of a current output, drive the current output with a short pulse, reduce leakage current at the OFF time when a current is not output, and realize a reduction of a power consumption and a PLL circuit using same. By outputting a charge current or a discharge current in accordance with an up signal or a down signal and turning on a third transistor (PC, NC) at the OFF time when the current is not output, an inverse bias voltage is supplied between a gate and a source of the second transistor (PA, NA), whereby a reduction of the leakage current can be realized. When the second or third transistor is switched in accordance with the up signal or the down signal, the timing of the control signal is appropriately controlled, simultaneous turning on of the second and third transistors can be avoided, release or injection of charges from and to the output terminal of the charge pump circuit can be prevented, and the stability of an oscillation frequency of a VCO can be improved.

4 Claims, 8 Drawing Sheets

CHARGE PUMP CIRCUIT AND PLL CIRCUIT USING SAME

This application is a continuation application of U.S. patent application Ser. No. 10/739,109, filed Dec. 19, 2003.

BACKGROUND OF THE INVENTION

1. Field of the Invention

The present invention relates to a charge pump circuit and a phase locked loop (PLL) circuit using a charge pump circuit, such as a PLL circuit for generating local oscillation signals in a wireless communication system and a charge pump circuit used for the same.

2. Description of Related Art

When a charge pump circuit is off, leakage current induces a voltage fluctuation of an output signal of the charge pump circuit and has become one of the causes of fluctuation in the oscillation frequency of a PLL circuit. For this reason, a reduction of the leakage current at the OFF time is an important characteristic required for the charge pump circuit. In recent years, power supply voltage has been lowered along with miniaturization of a semiconductor device, so it becomes necessary to lower a threshold voltage of a transistor for operation at a low voltage. Due to this, the leakage current at the OFF time of the transistor tends to increase.

Figure 8:
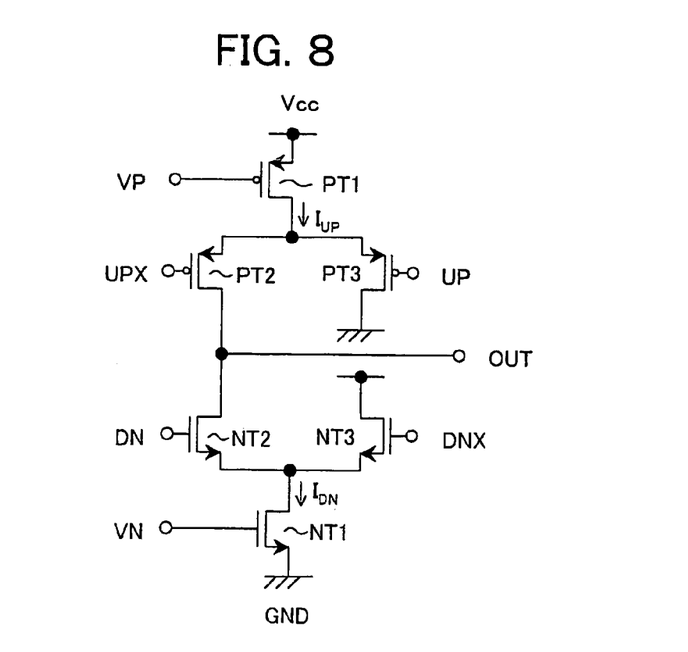
FIG. 8 is a circuit diagram of an example of the configuration of a conventional charge pump circuit.

FIG. 8 is a view showing an example of a charge pump circuit. As illustrated, this charge pump circuit is configured by nMOS transistors NT1, NT2, and NT3 and pMOS transistors PT1, PT2, and PT3. The transistors NT2 and NT3 form a differential pair circuit. The transistor NT1 is connected between a connection point of sources of the transistors NT2 and NT3 and a note of a ground potential and supplies a current to the differential operation pair circuit. Also, the transistors PT2 and PT3 form a differential operation pair circuit. The transistor PT1 is connected between the connection point of sources of the transistors PT2 and PT3 and a power supply terminal of a power supply voltage $V_{CC}$ and supplies the current to the differential operation pair circuit.

In the charge pump circuit, the differential operation pair circuit configured by the transistors NT2 and NT3 outputs a discharge current $I_{DN}$ to an output terminal OUT in accordance with a down signal DN and its logic inverted signal DNX. Namely, in accordance with the down signal DN and its logic inverted signal DNX, a pull-in current $I_{DN}$ flowing from the output terminal OUT to a ground potential GND is generated. On the other hand, the differential operation pair circuit configured by the transistors PT2 and PT3 outputs a charge current $I_{UP}$ to the output terminal OUT, in accordance with an up signal UP and its logic inverted signal UPX.

The charge pump circuit controls a current value of a discharge current $I_{DN}$ by a bias voltage VN supplied to the gate of the transistor NT1 and controls the current value of the charge current $I_{UP}$ by a bias voltage VP supplied to the gate of the transistor PT1. Further, the timing of the discharge current $I_{DN}$ and the charge current $I_{UP}$ is controlled by the down signal DN and the up signal UP, as explained above.

In the charge pump circuit, a reduction of the leakage current at the time of OFF can be achieved by enlarging the amplitudes of the up signal UP and its logic inverted signal UPX and the down signal DN and its logic inverted signal DNX. However, the current $I_{DN}$ and $I_{UP}$ flow through the transistors NT3 and PT3 also at the OFF time, so there is a problem of a large current consumption. Further, when switching the transistors NT2 and NT3 in accordance with the down signal DN and its logic inverted signal DNX or when switching the transistors PT2 and PT3 in accordance with the up signal UP and its logic inverted signal UPX, both transistors configuring the differential operation pair circuit are turned ON. For this reason, for example, when the down signal DN and its logic inverted signal DNX switch, both of the transistors NT2 and NT3 are turned ON, so the output terminal OUT and the supply side of the power supply voltage $V_{CC}$ are short circuited, and charges flow into the output terminal OUT. On the other hand, when the up signal UP and its logical inverted signal UPX switch, both of the transistors PT2 and PT3 are turned ON, so the output terminal OUT and the ground potential GND are short circuited, and charges flow out of the output terminal OUT.

In accordance with the inflow or outflow of the charges due to the switching of the down signal DN and the up signal UP explained above, a terminal voltage $V_C$ of a capacitor connected to the output terminal OUT of the charge pump circuit changes, so the oscillation frequency of a voltage controlled oscillator controlled by this terminal voltage $V_C$ deviates from the desired value.

Figure 9:
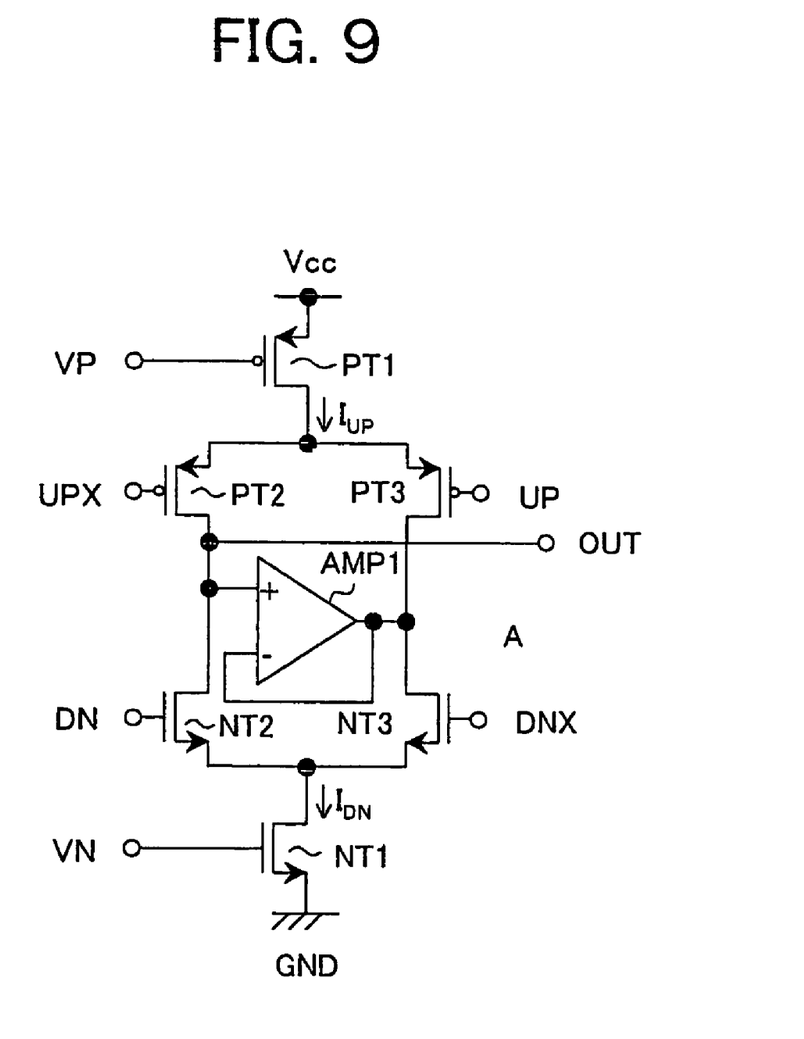
FIG. 9 is a circuit diagram of another example of the configuration of a conventional charge pump circuit.

In order to avoid the above problems, a charge pump circuit shown in FIG. 9 is proposed. As illustrated, in the charge pump circuit of the present example, a buffer amplifier AMP1 is provided. A positive input terminal of the buffer amplifier AMP1 is connected to the connection point of drains of the transistors NT2 and PT2, and the output terminal thereof and a negative input terminal are connected to a connection point A of drains of the transistors NT3 and PT3.

Namely, in this charge pump circuit, the buffer amplifier AMP1 configures a voltage follower. By this, the output terminal A of the buffer amplifier AMP1 is held at the same voltage as that of the positive input terminal thereof. For this reason, when switching the transistors in accordance with the down signal DN and its logic inverted signal DNX or when switching the transistors in accordance with the up signal UP and its logic inverted signal UPX, the inflow or outflow of charge current from the terminal A to the output terminal OUT can be prevented.

In the charge pump circuit shown in FIG. 9, however, the current $I_{DN}$ and the current $I_{UP}$ flow through the transistors NT3 and PT3 also at the OFF time, so the problem of large current consumption is not solved. Further, a buffer amplifier AMP1 requiring an output larger than the current $I_{DN}$ and the current $I_{UP}$ is necessary, so there are problems in that the power consumption further increases and the size of the circuit becomes large.

As related art, Japanese Unexamined Patent Publication (Kokai) No. 2001-177400, Japanese Unexamined Patent Publication (Kokai) No. 2000-269808, and "A PPL Generator with 5 to 110 MHz of Lock Range for Microprocessors", *IEEE Journal of Solid-State Circuits*, vol. 127, no. 11, November 1992, pp. 1599 to 1607, may be mentioned.

In order to reduce the leakage current at the OFF time in the conventional charge pump circuit explained above, a variety of measures have been taken. For example, in the charge pump circuit disclosed in Japanese Unexamined Patent Publication (Kokai) No. 2000-269808, when the current is not output, a back bias voltage is supplied to the transistor to reduce the leakage current at the OFF time.

For example, taking the circuit shown in FIG. 8 as an example, at the nMOS transistor side generating the discharge current $I_{DN}$, when the current $I_{DN}$ is not output, a signal of a low level of, for example, the ground potential level is supplied to the gates of the transistors NT1 and NT2, and a signal of a high level of, for example, the power supply voltage $V_{CC}$ is supplied to the gate of the transistor NT3. Due to this, the connection point of the sources of the transistors NT2 and NT3 configuring the differential operation pair circuit is held at the high level, for example, a voltage lower than the power supply voltage $V_{CC}$ by exactly the amount of a gate-source voltage $V_{gs}$ of the transistor NT3 ($V_{CC}$-$V_{gs}$). For this reason, a back bias voltage is supplied to the transistor NT2 to reduce the leakage current at the OFF time.

However, the signal actually determining the output timing of the discharge current $I_{DN}$ is the drive signal supplied to the gate of the transistor NT2. This drive signal is a switching control signal including the analog amplitude information. The current value of the current $I_{DN}$ is determined according to the amplitude. In general, it is difficult to raise this drive signal sharply. This is because a capacity in accordance with a load capacity is added to the gate of the transistor NT2 other than the gate capacity, so a larger drivability than the usual one is needed for driving the gate of the transistor NT2. Further, this drive signal is not a logic signal, but an analog signal also needing amplitude information, so a buffer circuit of a logic able to easily raise the drivability cannot be used.

Note that, in the charge pump circuit shown in FIG. 8, not only at the nMOS transistor side for generating the discharge current $I_{DN}$, but also at the pMOS transistor side for generating the charge current $I_{UP}$, similarly, the drive signal supplied to the gate of the transistor PT2 is an analog signal having amplitude information, so sharp rising is difficult due to the limitation of the drivability.

Due to the above reasons, the rising characteristic of the drive signal supplied to the gate of the transistor NT2 is poor, so it becomes impossible to drive this by a pulse signal having a short width. For this reason, in the PLL circuit connected to the output terminal OUT of the charge pump circuit, receiving the output current of the charge pump circuit, generating a control signal $S_C$, and controlling the oscillation frequency of the voltage control oscillator (VCO) by using this control signal $S_C$, there are the disadvantages that the precision of the control signal $S_C$ is lowered and it becomes impossible to control the oscillation frequency with a high precision.

SUMMARY OF THE INVENTION

An object of the present invention is to provide a charge pump circuit able to enhance the rising and falling characteristics of the current output, drive the current output with a short pulse, reduce the leakage current at the OFF time of not outputting the current, and realize a reduction of the power consumption and a PLL circuit using the same.

According to a first aspect of the invention, there is provided a charge pump circuit for outputting a current in a period in accordance with an effective period in accordance with an input signal held at a first level in the effective period and held at a second level in a period other than the effective period, comprising first and second transistors connected in series between a first power supply terminal and an output terminal of the charge pump circit; a third transistor connected between a connection point of the first and second transistors and a second power supply terminal; and a control signal generation circuit, the control signal generation circuit generating a first control signal for turning the first transistor on in the period in accordance with the effective period and for turning off the first transistor other than this in accordance with the input signal and supplying the first control signal to the control terminal of the first transistor, generating a second control signal for turning the second transistor on earlier than the first transistor being turned on and turning off the second transistor later than the first transistor being turned off and holding a level where a desired output current flows when the second transistor is on and supplying the second control signal to the control terminal of the second transistor, and generating a third control signal for turning off the third transistor before the second transistor being turned on turning on the third transistor after the second transistor is turned off and supplying the third control signal to the control terminal of the third transistor.

Preferably, the control signal generation circuit has a buffer for delaying the input signal by exactly a predetermined delay time and a logic gate for performing a logic operation in accordance with the input signal and an output signal of the buffer, the first control signal is generated in accordance with the output signal of the buffer, and the second control signal is generated in accordance with the output signal of the logic gate.

More preferably, the control signal generation circuit switches the level of the third control signal in accordance with a preliminary input signal having a phase advanced from the input signal, turns off the third transistor, switches the level of the third control signal in accordance with the second control signal, and turns the third transistor on.

According to a second aspect of the present invention, there is provided a PLL circuit having a phase comparison circuit generating a phase difference signal in accordance with a phase difference between a reference clock signal and a comparison target clock signal, a charge pump circuit for outputting a current in accordance with the phase difference signal, and an oscillation circuit oscillating at a predetermined oscillation frequency in accordance with the control signal generated in accordance with the output current of the charge pump circuit, generating the comparison target clock signal in accordance with the oscillation signal, and outputting it to the phase comparison circuit, wherein the PLL circuit has a locked state detection circuit for detecting whether or not the PLL circuit is in a locked state, the charge pump circuit includes first and second transistors connected in series between a first power supply and an output terminal, a third transistor connected between a connection point of the first and second transistors and a second power supply, and a control signal generation circuit, and the control signal generation circuit generates a first control signal for turning on the first transistor in a period in accordance with an effective period of the phase difference signal when it is detected by the locked state detection circuit that the PLL circuit is in the locked state and turning off the first transistor at times other than this in accordance with the phase difference signal and supplies it to the control terminal of the first transistor, generates a second control signal for turning on the second transistor earlier than the first transistor being turned on, turning off the second transistor later than the first transistor being turned off, and holding a level where a desired output current flows when the second transistor is conductive and supplies it to the control terminal of the second transistor, and generates a third control signal for turning off the third transistor earlier than the second transistor being turned on and turning on the third transistor later than the second transistor being turned off and supplies this to the control terminal of the third transistor.

Preferably, the third transistor is held in the on state in a period where the phase difference signal is not input in the charge pump circuit, and an inverse bias voltage is supplied between a gate and a source of the second transistor.

According to a third aspect of the present invention, there is provided a PLL circuit having a phase comparison circuit for comparing a phase difference between a reference clock signal and a comparison target clock signal and outputting an up signal or a down signal in accordance with the phase difference between the reference clock signal and the comparison target clock signal, a locked state detection circuit for detecting whether or not the PLL circuit is in a locked state in accordance with the up signal or down signal, a charge pump circuit for outputting a charge current or a discharge current to an output terminal in accordance with the up signal or down signal, a filter connected to the output terminal of the charge pump circuit and outputting a control signal in accordance with the output current of the charge pump circuit, and an oscillation circuit for generating an oscillation signal at a desired frequency in accordance with the control signal and outputting the signal in accordance with the oscillation signal as the comparison target clock signal to the phase comparison circuit, wherein the charge pump circuit has first conductivity type first and second transistors connected in series between the power supply terminal and the output terminal, a third transistor connected between the connection point of the first and second transistors and a reference potential, a first control signal generation circuit for receiving the up signal, generating a first charge control signal for turning on the first transistor in accordance with the effective period of the up signal and turning off the first transistor in a period other than the effective period, supplying the same to the control terminal of the first transistor, generating a second charge control signal for turning on the second transistor earlier than the first transistor being turned on, turning off the second transistor later than the first transistor being turned off, and outputting a desired charge current to the output terminal at the time when the second transistor is on, supplying the same to the control terminal of the second transistor, generating a third charge control signal for turning off the third transistor earlier than the second transistor being turned on and turning on the third transistor later than the second transistor being turned off, and supplying the same to the control terminal of the third transistor, second conductivity type fourth and fifth transistors connected in series between the reference potential and the output terminal, a sixth transistor connected between the connection point of the fourth and fifth transistors and the power supply terminal, and a second control signal generation circuit receiving the down signal, generating a first discharge control signal for turning on the fourth transistor in accordance with the effective period of the down signal and turning off the fourth transistor in a period other than the effective period, supplying the same to the control terminal of the fourth transistor, generating a second discharge control signal for turning on the fifth transistor earlier than the fourth transistor being turned on, turning off the fifth transistor later than the fourth transistor being turned off, and outputting a desired discharge current to the output terminal at the on time, supplying the same to the control terminal of the fifth transistor, and generating a third discharge control signal for turning off the sixth transistor earlier than the fifth transistor being turned on and turning on the sixth transistor later than the fifth transistor being turned off, and supplying the same to the control terminal of the sixth transistor.

Preferably, the third transistor is held in the on state in the period where the up signal is not input, and an inverse bias voltage is supplied between the gate and the source of the second transistor.

Preferably, the sixth transistor is held in the on state in the period where the down signal is not input, and an inverse bias voltage is supplied between the gate and the source of the fifth transistor.

According to the present invention, the charge pump circuit outputs the charge current or the discharge current in accordance with the up signal or the down signal output by the phase comparison circuit. At the OFF time when the up signal and the down signal are not output, by turning on the third transistor, an inverse bias voltage is supplied between the gate and the source of the second transistor to achieve a reduction of the leakage current.

Further, when switching the second or third transistor in accordance with the up signal or the down signal, by appropriately controlling the timing of the control signal, by turning off the third transistor earlier than the second transistor being turned on, and by turning on the third transistor later than the second transistor being turned off, the second and third transistors being simultaneously on can be avoided, the release or injection of charge current from or to the output terminal of the charge pump circuit can be prevented, and the stability of the oscillation frequency of the VCO can be improved.

Further, by controlling the timing of the charge current and the discharge current output by the charge pump circuit by the lock signal supplied to the first transistor, a large drivability can be secured, the rising and falling edges of the output current can be sharply controlled, and therefore it is possible to control the oscillation frequency of the VCO with a high precision.

BRIEF DESCRIPTION OF THE DRAWINGS

The above object and features of the present invention will be more apparent from the following description of the preferred embodiments given with reference to the accompanying drawings, wherein.

DESCRIPTION OF PREFERRED EMBODIMENTS

Below, an explanation will be given of embodiments of the present invention with reference to the drawings.

First Embodiment

Figure 1:
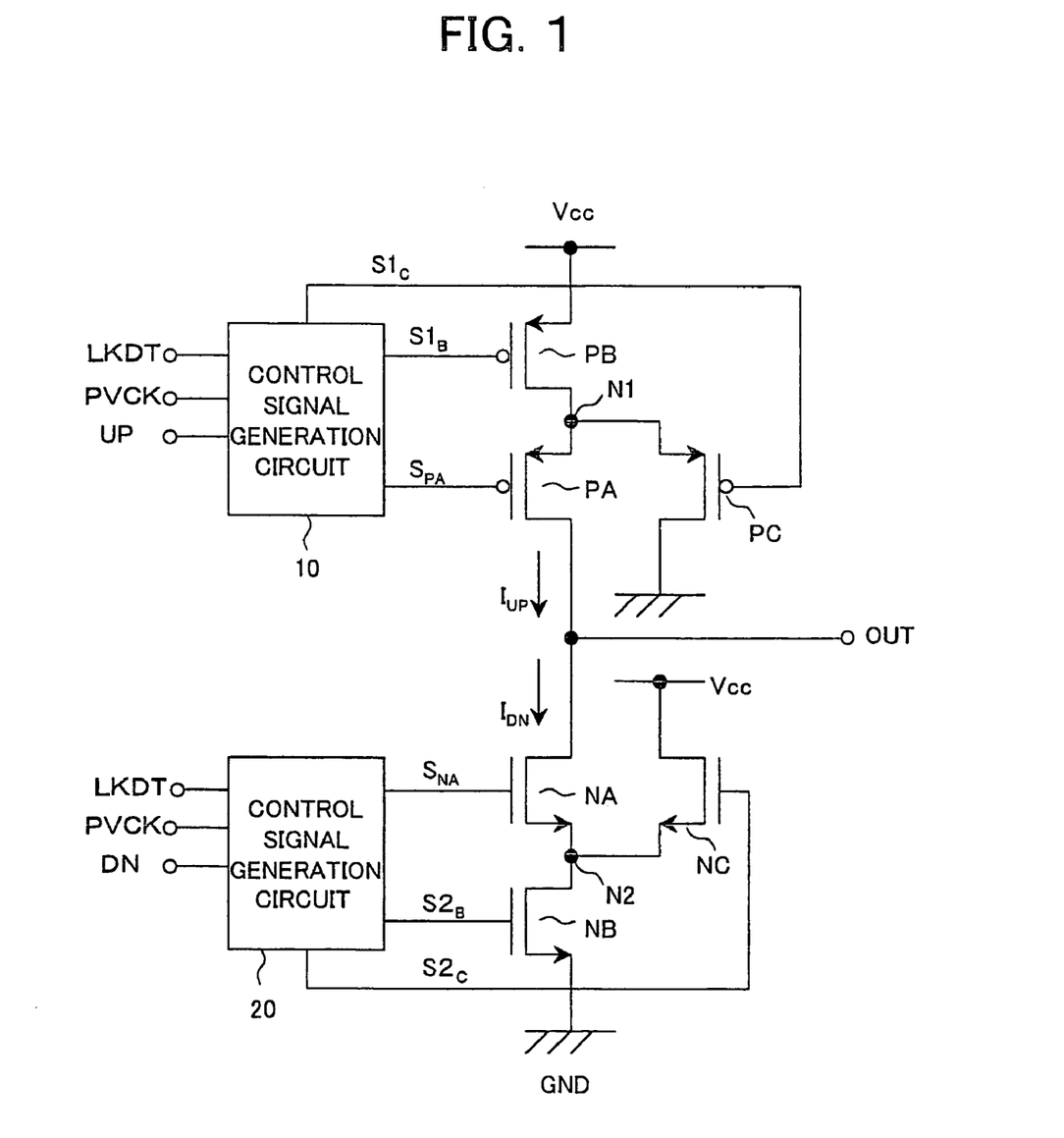
FIG. 1 is a circuit diagram of a first embodiment of a charge pump circuit according to the present invention.

FIG. 1 is a circuit diagram of a first embodiment of a charge pump circuit according to the present invention.

As illustrated, the charge pump circuit of the present embodiment is configured by nMOS transistors NA, NB, and NC, pMOS transistors PA, PB, and PC, and control signal generation circuits 10 and 20.

The transistors PB and PA are connected in series between a terminal of the power supply voltage $V_{CC}$ and an output terminal OUT of the charge pump circuit. Namely, the source of the transistor PB is connected to the terminal supplied with the power supply voltage $V_{CC}$, and the drain is connected to a source of the transistor PA. The drain of the transistor PA is connected to the output terminal OUT. The source of the transistor PC is connected to a connection point N1 between the drain of the transistor PB and the source of the transistor PA, and the drain is grounded.

The gate of the transistor PA is supplied with an analog control signal $S_{PA}$ output by the control signal generation circuit 10, the gate of the transistor PB is supplied with a control signal $S1_B$ output by the control signal generation circuit 10, and the gate of the transistor PC is supplied with a control signal $S1_C$ output by the control signal generation circuit 10.

The transistors NA and NB are connected in series between the output terminal OUT and the ground potential. Namely, the drain of the transistor NA is connected to the output terminal OUT, and the source is connected to the drain of the transistor NB. The source of the transistor NB is grounded. The source of the transistor NC is connected to a connection point N2 between the source of the transistor NA and the drain of the transistor NB, and the drain is connected to the terminal supplied with the power supply voltage $V_{CC}$.

The gate of the transistor NA is supplied with an analog control signal $S_{NA}$ output by the control signal generation circuit 20, the gate of the transistor NB is supplied with a control signal $S2_B$ output by the control signal generation circuit 20, and the gate of the transistor NC is supplied with a control signal $S2_C$ output by the control signal generation circuit 20.

Next, an explanation will be given of the configurations of the control signal generation circuits 10 and 20.

Figure 2:
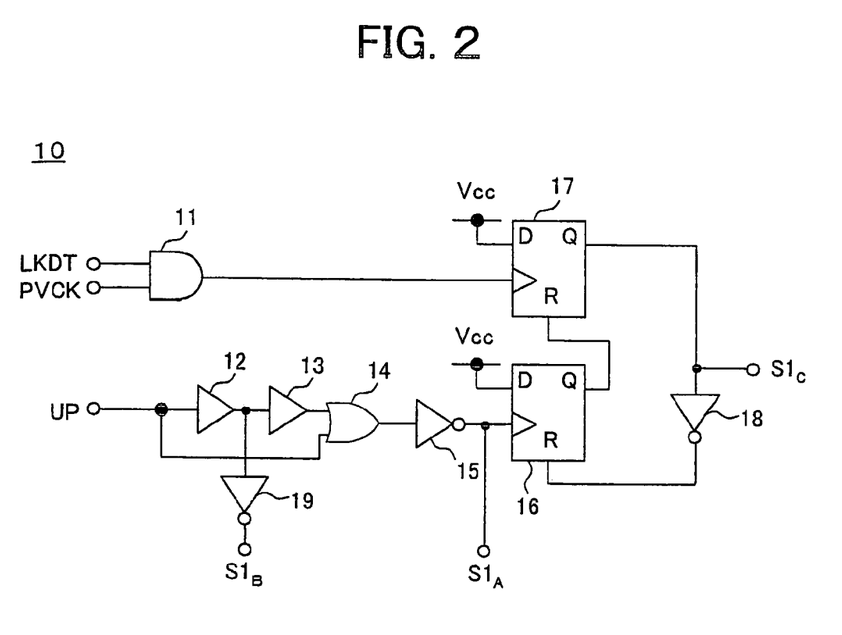
FIG. 2 is a circuit diagram of the configuration of a control signal generation circuit forming part of a charge pump circuit.

FIG. 2 is a circuit diagram of an example of the configuration of the control signal generation circuit 10.

As shown in FIG. 2, the control signal generation circuit 10 is configured by an AND gate 11, buffers 12 and 13, an OR gate 14, an inverter 15, D-flip-flops 16 and 17, and inverters 18 and 19.

The AND gate 11 receives as input a lock detection signal LKDT of a lock detection circuit provided in the PLL circuit and a preliminary frequency divided clock signal PVCK. Note that the lock detection signal LKDT is activated when the PLL circuit is in the locked state, for example, held at the high level, and is held at the low level in other cases. The preliminary frequency divided clock signal PVCK is a pulse signal generated by the frequency division circuit provided in the PLL circuit and output faster than the frequency divided clock signal VCK by exactly one cycle's worth of the oscillation signal of the voltage controlled oscillator (VCO).

The output signal of the AND gate 11 is input to the clock input terminal of the D-flip-flop 17.

The buffers 12 and 13 are cascade connected. The input terminal of the buffer 12 receives as input the up signal UP.

One terminal of the OR gate 14 receives as input the output signal of the buffer 13, while the other input terminal receives as input the up signal UP.

The output signal of the OR gate 14 is inverted by the inverter 15 and input to the clock input terminal of the D-flip-flop 16.

The output signal from the output terminal Q of the D-flip-flop 16 is input to a reset terminal of the D-flip-flop 17, while the output signal from the output terminal Q of the D-flip-flop 17 is inverted by the inverter 18 and input to the reset terminal of the D-flip-flop 16.

As shown in FIG. 2, the control signal generation circuit 10 outputs a control signal $S1_A$ from the inverter 15, inverts the output signal of the buffer 12 by the inverter 19, and outputs the result as a control signal $S1_B$. It outputs the output signal from the output terminal Q of the D-flip-flop 17 as a control signal $S1_C$. Further, it generates the analog control signal $S_{PA}$ in accordance with the control signal $S1_A$.

Below, an explanation will be given of the operation of the control signal generation circuit 10.

The control signal generation circuit 10 outputs the control signal $S1_C$ when the PLL circuit is in the locked state, that is, when the lock detection signal LKDT is at the high level. At times other than this, the output signal of the AND gate 11 is held at the low level, so the D-flip-flop 17 does not operate, and the control signal $S1_C$ is held at the low level of the reset state. At this time, the control signals $S1_A$ and $S1_B$ are generated in accordance with the up signal UP. Namely, when the PLL circuit does not reach the locked state, the control signals $S1_A$ and $S1_B$ are output, and the oscillation frequency of the VCO in accordance with them is controlled.

FIGS. 3A to 3I are waveform diagrams showing the operation of the control signal generation circuit 10 when reaching the locked state. Below, an explanation will be given of the operation of the control signal generation circuit 10 while referring to FIG. 2 and FIGS. 3A to 3I.

Figure 3A:
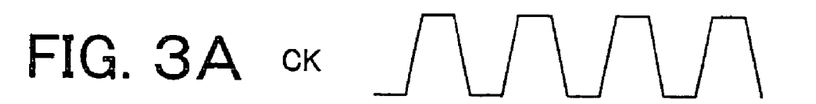
FIGS. 3A to 3I are waveform diagrams showing the operation of the control signal generation circuit.
Figure 3B:
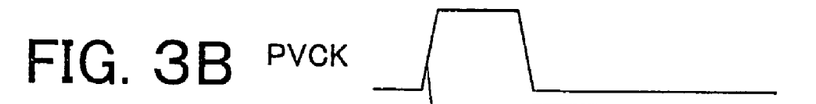
Figures 3C, 3D:
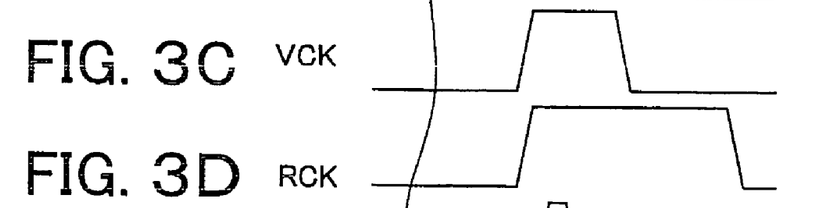
Figure 3E:
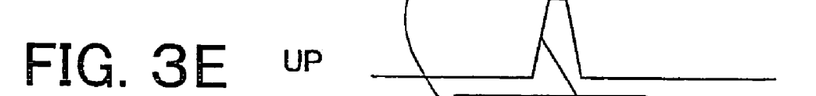
Figure 3F:
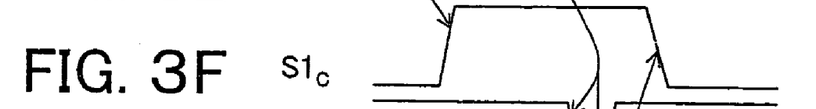

When the preliminary frequency divided clock signal PVCK rises to the high level, the output signal of the AND gate 11 rises, and in accordance with this, as shown in FIG. 3F, the output of the D-flip-flop 17, that is, the control signal $S1_C$, changes from the low level to the high level.

Figures 3G, 3H:
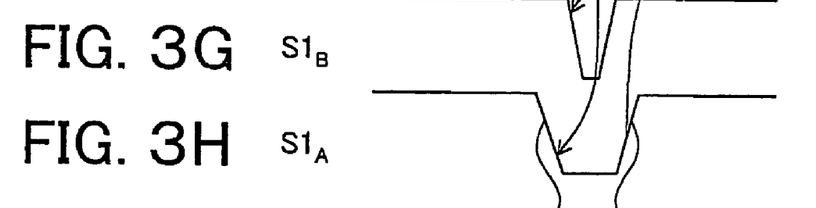

Next, as shown in FIG. 3G, the control signal $S1_B$ switches from the high level to the low level delayed from the rising edge of the up signal UP by exactly the delay time of the buffer 12.

The buffer 13 further delays the output signal of the buffer 12. Namely, the up signal UP delayed by the two buffers 12 and 13 and an original up signal UP are input to the OR gate 14 together.

For this reason, the OR gate 14 outputs a pulse signal having a broader width than the control signal $S1_B$. Further, the output signal of the OR gate 14 is inverted by the inverter 15 and input to the clock input terminal of the D-flip-flop 16.

Figure 3I:
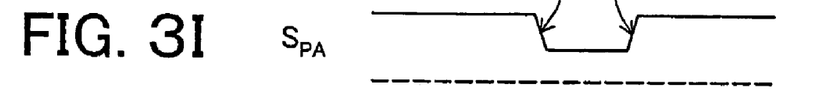

Note that the output of the inverter 15 is extracted as the control signal $S1_A$. FIG. 3H shows the waveform of the control signal $S1_A$. Further, in accordance with the control signal $S1_A$, the analog control signal $S_{PA}$ having a predetermined amplitude is generated as shown in FIG. 3I. The current value of the charge current $I_{UP}$ is controlled in accordance with the amplitude of the analog control signal $S_{PA}$.

In accordance with the rising edge of the output of the inverter 15, the output of the D-flip-flop 16 switches to the high level, and the D-flip-flop 17 is reset in accordance with this. Namely, the control signal $S1_C$ falls from the high level to the low level (FIG. 3F).

As explained above, the control signal generation circuit 10 generates the control signals $S1_A$, $S1_B$, and $S1_C$ in accordance with the preliminary frequency divided clock signal PVCK from the frequency divider provided in the PLL circuit and the up signal UP from the phase comparison circuit. The control signals $S1_B$ and $S1_C$ are supplied to the gates of the transistors PB and PC of the charge pump circuit shown in FIG. 1, and the analog control signal $S_{PA}$ having the desired amplitude is generated in accordance with the control signal $S1_A$ and supplied to the gate of the transistor PA. In accordance with this, the charge pump circuit outputs the charge current $I_{UP}$ in accordance with the amplitude of the analog control signal $S_{PA}$ to be supplied to the gate of the transistor PA to the output terminal OUT during an effective period of the up signal UP, that is, during the period where the up signal UP is held at the high level.

Next, an explanation will be given of the configuration of the control signal generation circuit 20 while referring to FIG. 4.

Figure 4:
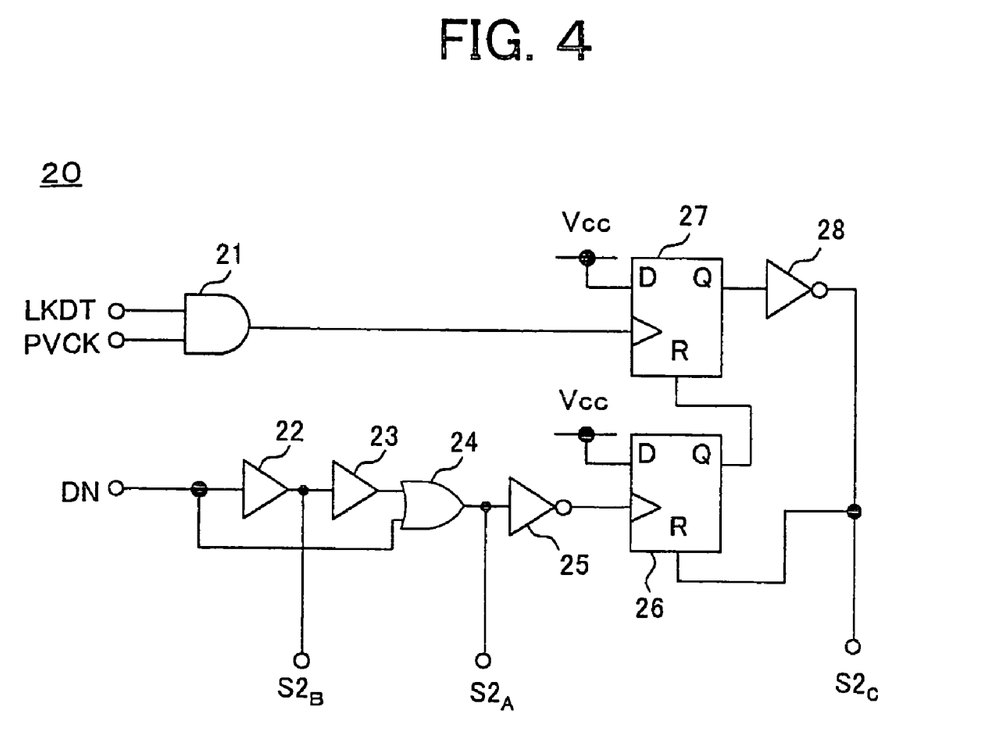
FIG. 4 is a circuit diagram of the configuration of a control signal generation circuit forming part of the charge pump circuit.

FIG. 4 is a circuit diagram of an example of the configuration of the control signal generation circuit 20.

As shown in FIG. 4, the control signal generation circuit 20 is configured by an AND gate 21, buffers 22 and 23, an OR gate 24, an inverter 25, D-flip-flops 26 and 27, and an inverter 28.

The AND gate 21 receives as input the lock detection signal LKDT and the preliminary frequency divided clock signal PVCK. The output signal of the AND gate 21 is input to the clock input terminal of the D-flip-flop 27.

The buffers 22 and 23 are cascade connected. The input terminal of the buffer 22 receives as input the down signal DN.

One terminal of the OR gate 24 receives as input the output signal of the buffer 23, while the other input terminal receives as input the down signal DN.

The output signal of the OR gate 24 is inverted by the inverter 25 and input to the clock input terminal of the D-flip-flop 26.

The output signal from the output terminal Q of the D-flip-flop 26 is input to the reset terminal of the D-flip-flop 27, and the output signal from the output terminal Q of the D-flip-flop 27 is inverted by the inverter 28 and input to the reset terminal of the D-flip-flop 26.

As shown in FIG. 4, the control signal generation circuit 20 outputs the control signal $S2_A$ from the OR gate 24 and outputs the control signal $S2_B$ from the buffer 22. It outputs the inverted signal of the output signal of the D-flip-flop 27, that is, the output signal S of the inverter 28, as the control signal $S2_C$. Further, it generates the analog control signal $S_{NA}$ in accordance with the control signal $S2_A$.

Below, an explanation will be given of the operation of the control signal generation circuit 20.

The control signal generation circuit 20 outputs the control signal $S2_C$ when the PLL circuit reaches the locked state, that is, when the lock detection signal LKDT is at the high level, in the same way as the control signal generation circuit 10 shown in FIG. 2. At times other than this, the output signal of the AND gate 21 is held at the low level, so the D-flip-flop 27 does not operate, and the control signal $S2_C$ is held at the high level of the reset state.

FIGS. 5A to 5I are waveform diagrams showing the operation of the control signal generation circuit 20. Below, an explanation will be given of the operation of the control signal generation circuit 20 while referring to FIG. 4 and FIGS. 5A to 5I.

Figure 5A:
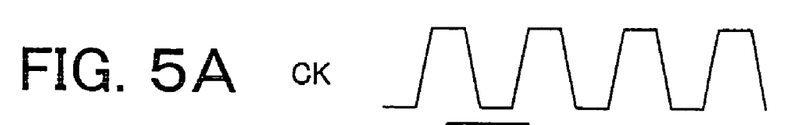
FIGS. 5A to 5I are waveform diagrams showing the operation of the control signal generation circuit.
Figures 5B, 5C:
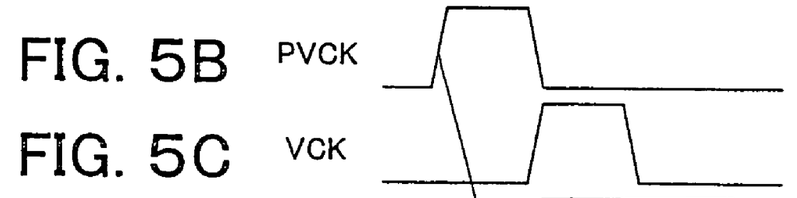
Figures 5D, 5E:
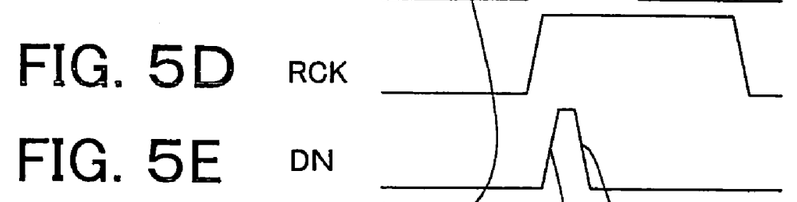
Figure 5F:
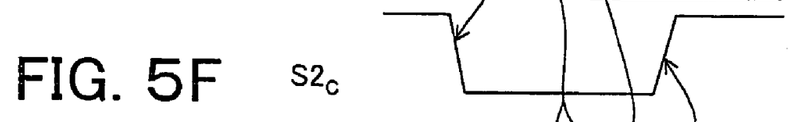

When the preliminary frequency divided clock signal PVCK rises to the high level, the output signal of the AND gate 21 rises, and the output signal of the D-flip-flop 27 rises from the low level of the reset state to the high level in accordance with this. In accordance with this, as shown in FIG. 5F, the output signal of the inverter 28, that is, the control signal $S2_C$, changes from the high level to the low level.

Figure 5G:
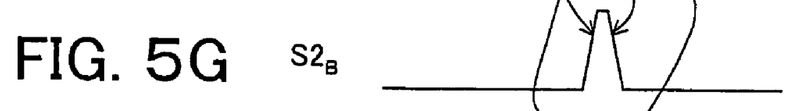

Next, as shown in FIG. 5G, the control signal $S2_B$ switches from the low level to the high level delayed from the rising edge of the down signal DN by exactly the delay time of the buffer 22.

The buffer 23 further delays the output signal of the buffer 22. Namely, the down signal DN delayed by the two buffers 22 and 23 and the original down signal DN are input to the OR gate 24 together.

For this reason, the OR gate 24 outputs a pulse signal having a broader width than the control signal $S2_B$, and the output signal of the OR gate 24 is inverted by the inverter 25 and input to the clock input terminal of the D-flip-flop 26.

Figure 5H:
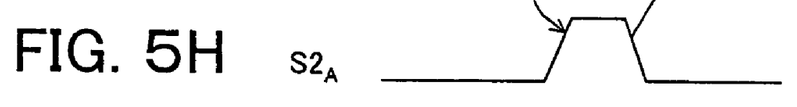
Figure 5I:
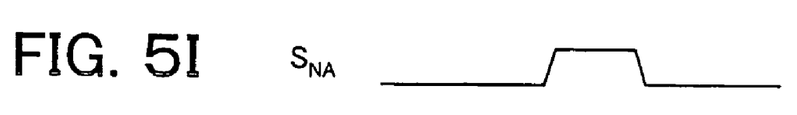

Note that the output of the OR gate 24 is extracted as the control signal $S2_A$. FIG. 5H shows a waveform of the control signal $S2_A$. Further, in accordance with the control signal $S2_A$, an analog control signal $S_{NA}$ having a predetermined amplitude is generated as shown in FIG. 5I. In accordance with the amplitude of the analog control signal $S_{NA}$, the current value of the discharge current $I_{DN}$ is controlled.

In accordance with the rising edge of the output of the inverter 25, the output of the D-flip-flop 26 switches to the high level, the D-flip-flop 27 is reset, and the output signal thereof falls from the high level to the low level. In accordance with this, as shown in FIG. 5F, the output signal of the inverter 28, that is, the control signal $S2_C$, rises from the low level to the high level.

As explained above, the control signal generation circuit 20 generates the control signals $S2_A$, $S2_B$, and $S2_C$ in accordance with the preliminary frequency divided clock signal PVCK and the down signal DN. The control signals $S2_B$ and $S2_C$ are supplied to the gates of the transistors NB and NC of the charge pump circuit shown in FIG. 1, and the analog control signal $S_{NA}$ having a desired amplitude is generated in accordance with the control signal $S2_A$ and supplied to the gate of the transistor NA. In accordance with this, the charge pump circuit outputs the discharge current $I_{DN}$ in accordance with the amplitude of the analog control signal $S_{NA}$ to be supplied to the gate of the transistor NA to the output terminal OUT during the effective period of the down signal DN, that is, during the period where the down signal DN is held at the high level.

In the charge pump circuit of the present embodiment, the control signal generation circuits 10 and 20 generate the charge current $I_{UP}$ and the discharge current $I_{DN}$ in accordance with the up signal UP and the down signal DN generated by the phase comparison circuit and output the same to the output terminal OUT.

Next, an explanation will be given of the overall operation of the charge pump circuit of the present embodiment.

As explained above, the charge pump circuit of the present embodiment outputs the charge current $I_{UP}$ and the discharge current $I_{DN}$ in accordance with the up signal UP and the down signal DN.

Here, first, an explanation will be given of the operation of the portion outputting the charge current $I_{UP}$ in accordance with the up signal UP.

As shown in the waveform diagrams of FIGS. 3A to 3I, at times other than the effective period of the up signal UP, that is, when the up signal UP is at the low level, the control signals $S1_A$ and $S1_B$ are held at the high level, and the control signal $S1_C$ is held at the low level. Further, the analog control signal $S_{PA}$ generated in accordance with the control signal $S1_A$ is held at substantially the power supply voltage $V_{CC}$. For this reason, in the charge pump circuit, the transistor PC becomes on and the transistors PA and PB become off. The source voltage of the transistor PA in the off state is held at substantially the ground potential GND, and the gate voltage is held at substantially the power supply voltage $V_{CC}$, so an inverse bias voltage is supplied between the gate and the source of the transistor PA. For this reason, the leakage current of the transistor PA is reduced in comparison with the case of a zero bias, that is, where $V_{GS}=0$.

Next, before the rising edge of the up signal UP, the preliminary frequency divided clock signal PVCK is output. In accordance with this, the control signal $S1_C$ rises from the low level to the high level, and the transistor PC switches from the on state to the off state.

Next, the up signal UP rises and is held at the high level in the predetermined period. Here, the period where the up signal UP is at the high level will be referred to as the effective period.

As shown in FIGS. 3A to 3I, according to the rising of the up signal UP, the control signals $S1_A$ and $S1_B$ sequentially switch to the low level. In accordance with the control signal $S1_A$, the analog control signal $S_{PA}$ having a predetermined amplitude is output. Then, when the control signal $S1_B$ switches to the low level, both of the transistors PB and PA are in the on state, and a current path is formed from the terminal of the power supply voltage $V_{CC}$ to the output terminal OUT, so the charge current $I_{UP}$ is output to the output terminal OUT. Note that the current value of the charge current $I_{UP}$ is determined according to the level of the analog control signal $S_{PA}$ supplied to the gate of the transistor PA.

After the elapse of the effective period, the up signal UP switches to the low level. In accordance with this, the control signal $S1_B$ switches to the high level, and then the control signal $S1_A$ switches to the high level. In accordance with this, the analog control signal $S_A$ is held at the high level, for example, the level near the power supply voltage $V_{CC}$. Accordingly, after the elapse of the effective period of the up signal UP, the transistors PB and PA sequentially switch to the off state.

Next, according to the rising edge of the control signal $S1_A$, the control signal $S1_C$ switches from the high level to the low level. In accordance with this, the transistor PC switches from the off state to the on state.

As explained above, in the operation outputting the charge current $I_{UP}$ in accordance with the up signal UP, the transistor PC switches to the off state before the transistor PA switches to the on state, and the transistor PC switches to the on state after the transistor PA switches to the off state. Namely, in the switching operation of the transistors, the transistors PA and PC simultaneously becoming the on state is avoided, and the leakage of the charge from the output terminal OUT can be prevented. By this, the fluctuation of the terminal voltage of the capacitor in the low pass filter due to the switching of the transistors can be suppressed, and the fluctuation of the oscillation frequency of the VCO can be suppressed.

Further, the output timing of the charge current $I_{UP}$ is determined according to the control signal $S1_B$ supplied to the gate of the transistor PB. The control signal $S1_B$ is a logic signal of a large amplitude, and a large drivability thereof can be secured, so the rising and falling edges of the charge current $I_{UP}$ can be made sharper, the pulse width of the charge current $I_{UP}$ can be made smaller by this, the voltage level of the control signal can be controlled with a higher precision, and accordingly the oscillation frequency of the VCO can be controlled with a high precision.

Next, an explanation will be given of the output operation of the discharge current $I_{DN}$ in accordance with the down signal DN.

The down signal DN is held at the high level in the predetermined effective period in the same way as the up signal UP. The charge pump circuit generates the discharge current $I_{DN}$ in accordance with the effective period of the down signal DN. Note that the discharge current $I_{DN}$ is the pull-in current from the output terminal OUT of the charge pump circuit.

As shown in the waveform diagrams of FIGS. 5A to 5I, at times other than the effective period of the down signal DN, that is, when the down signal DN is at the low level, the control signals $S2_A$ and $S2_B$ are held at the low level, and the control signal $S2_C$ is held at the high level. Further, the analog control signal $S_{NA}$ generated in accordance with the control signal $S2_A$ is held at substantially the ground potential GND. For this reason, the transistor NC becomes on, and the transistors NA and NB become off. Further, the source voltage of the transistor NA in the off state is held at substantially the power supply voltage $V_{CC}$, and the gate voltage is held at the ground potential GND, so the inverse bias voltage is supplied between the gate and the source of the transistor NA. For this reason, the leakage current thereof is reduced in comparison with the case of the zero bias, that is, where $V_{GS}=0$.

Next, the preliminary frequency divided clock signal PVCK is output before the rising edge of the down signal DN. In accordance with this, the control signal $S2_C$ switches from the high level to the low level, and the transistor NC switches from the on state to the off state.

Next, the down signal DN rises and is held at the high level in the effective period.

As shown in FIG. 5, according to the rising of the down signal DN, the control signals $S2_A$ and $S2_B$ sequentially switch to the high level. Further, in accordance with the control signal $S2_A$, the analog control signal $S_{NA}$ having a predetermined amplitude is output. Then, when the control signal $S2_B$ switches to the high level, both of the transistors NB and NA are in the on state, and the current path is formed from the output terminal OUT of the charge pump circuit to the ground potential GND, so the discharge current $I_{DN}$ is pulled from the output terminal OUT. Note that the current value of the discharge current $I_{DN}$ is determined according to the level of the analog control signal $S_{NA}$ supplied to the gate of the transistor NA.

After the elapse of the effective period, the down signal DN switches to the low level. In accordance with this, the control signal $S2_B$ switches to the low level, and then the control signal $S2_A$ switches to the low level. The analog control signal $S_{NA}$ is held at the low level, for example, substantially the ground potential. For this reason, the transistors NB and NA sequentially switch to the off state when the down signal DN passes the effective period.

Next, according to the falling edge of the control signal $S2_A$, the control signal $S2_C$ switches from the low level to the high level. In accordance with this, the transistor NC switches from the off state to the on state.

As explained above, in the operation outputting the discharge current $I_{DN}$ in accordance with the down signal DN, the transistor NC switches to the off state before the transistor NA switches to the on state, and the transistor NC switches to the on state after the transistor NA switches to the off state. Namely, in the switching operation of the transistors, the transistors NA and NC simultaneously becoming the on state is avoided, and the injection of charges to the output terminal OUT can be prevented. Due to this, the fluctuation of the terminal voltage of the capacity in the low pass filter due to the switching of the transistors can be suppressed, and the fluctuation of the oscillation frequency of the VCO can be suppressed.

Further, the output timing of the discharge current $I_{DN}$ is determined according to the control signal $S2_B$ supplied to the gate of the transistor NB. The control signal $S2_B$ is a logic signal of a large amplitude, and a large drivability thereof can be secured, so the rising and falling edges of the discharge current $I_{DN}$ can be made sharper, the pulse width of the discharge current $I_{DN}$ can be made smaller by this, the voltage level of the control signal can be controlled with a higher precision, and accordingly the oscillation frequency of the VCO can be controlled with a high precision.

As explained above, according to the charge pump circuit of the present embodiment, the charge current $I_{UP}$ and the discharge current $I_{DN}$ are generated in accordance with the up signal UP and the down signal DN from the phase comparison circuit, and at the OFF time when any of the up signal UP and the down signal DN is not output, the transistor PC and the transistor NC are turned on, thereby to hold the source voltage of the transistor PA lower than the gate voltage and hold the source voltage of the transistor NA higher than the gate voltage, whereby the inverse bias is supplied between the gate and the source of the transistors PA and NA, and the leakage current can be reduced. Further, when switching the transistors in accordance with the up signal UP or the down signal DN, by appropriately controlling the timing of the switch, the state where the transistors PA and PC are simultaneously on or the state where the transistors NA and NC are simultaneously on is avoided, the leakage or injection of charge of the output terminal OUT due to the switching of the transistors can be avoided, the fluctuation of the control voltage to be supplied to the VCO can be suppressed, and accordingly the fluctuation of the oscillation frequency of the VCO can be suppressed. Further, in the charge pump circuit of the present embodiment, the output timing of the charge current $I_{UP}$ and the discharge current $I_{DN}$ is controlled according to a logic control signal of a large amplitude to be supplied to the gates of the transistors PB and NB. For this reason, the gate drivability of the transistor can be easily raised, the rising and falling edges of the charge current $I_{UP}$ and the discharge current $I_{DN}$ can be made sharper, and accordingly the pulse width of the output current can be made smaller and the oscillation frequency of the VCO can be controlled with a high precision.

Second Embodiment

Figure 6:
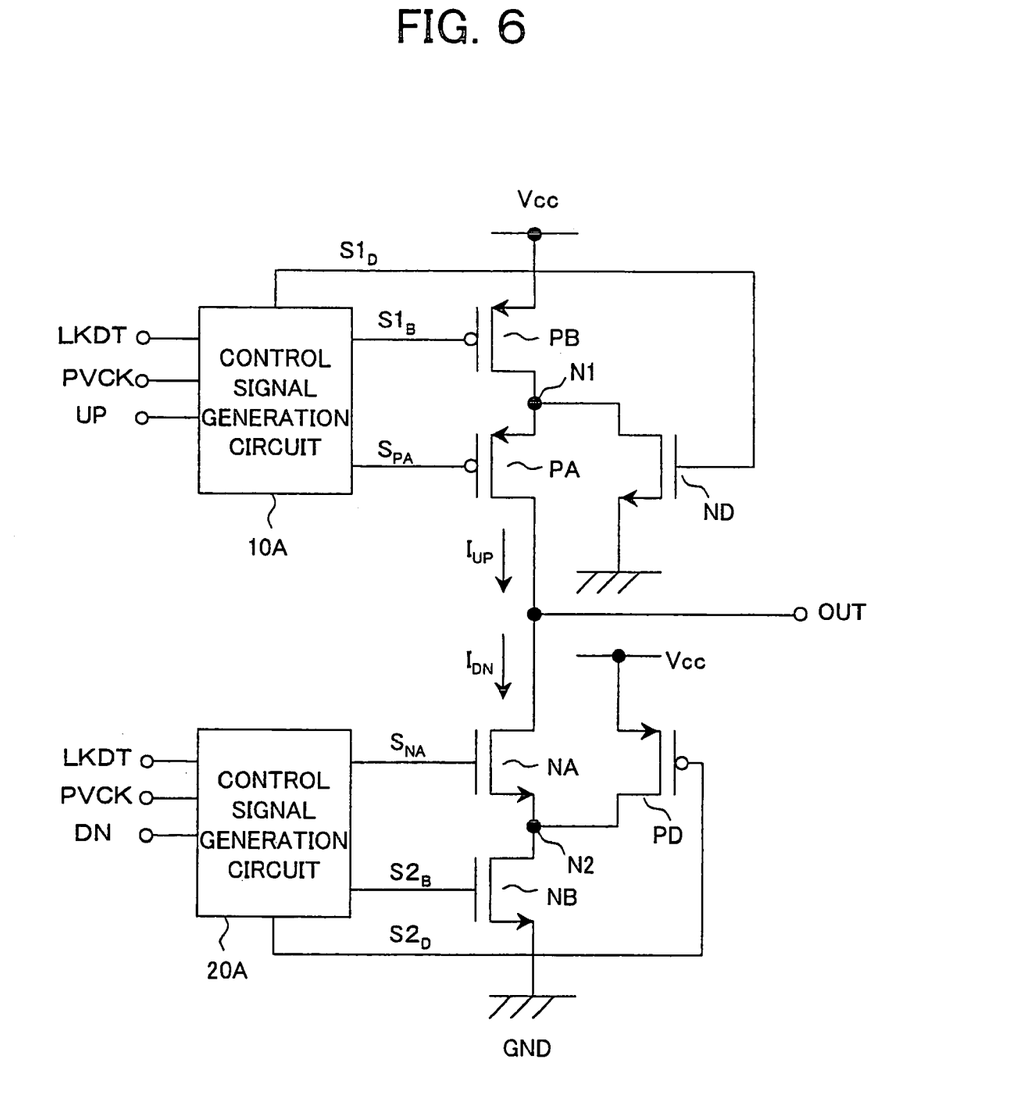
FIG. 6 is a circuit diagram of a second embodiment of a charge pump circuit according to the present invention.

FIG. 6 is a circuit diagram of a second embodiment of a charge pump circuit according to the present invention.

As illustrated, the charge pump circuit of the present embodiment is configured by control signal generation circuits 10A and 20A, pMOS transistors PA, PB, and PD, and nMOS transistors NA, NB and ND.

In comparison with the first embodiment of the charge pump circuit of the present invention shown in FIG. 1, in the charge pump circuit of the present embodiment, an nMOS transistor ND is used in place of the pMOS transistor PC, and a pMOS transistor PD is used in place of the nMOS transistor NC.

As shown in FIG. 6, in the transistor ND, the drain is connected to the connection point N1 of the drain of the transistor PB and the source of the transistor PA, and the source is grounded. The gate of the transistor ND is supplied with the control signal $S1_D$ output by the control signal generation circuit 10A.

On the other hand, in the transistor PD, the source is connected to the terminal supplied with the power supply voltage $V_{CC}$, and the drain is connected to the connection point of the source of the transistor NA and the drain of the transistor NB. Further, the gate of the transistor PD is supplied with the control signal $S2_D$ output by the control signal generation circuit 20A.

Further, in the charge pump circuit of the present embodiment, the control signal $S1_D$ output by the control signal generation circuit 10A is the logic inverted signal of the control signal $S1_C$ output by the control signal generation circuit 10 of the first embodiment explained above, and the control signal $S2_D$ output by the control signal generation circuit 20A is the logic inverted signal of the control signal $S2_C$ output by the control signal generation circuit 20 of the first embodiment.

The charge pump circuit of the present embodiment is substantially the same in configuration as the charge pump circuit of the first embodiment of the present invention shown in FIG. 1, except for the differences of the configuration explained above. For this reason, the charge pump circuit of the present embodiment operates in the same way as the charge pump circuit of the first embodiment and outputs the charge current $I_{UP}$ or the discharge current $I_{DN}$ to the output terminal OUT in accordance with the up signal UP or the down signal DN.

Further, at the OFF time when the up signal UP and the down signal DN are not output, the control signal generation circuits 10A and 20A output control signals for turning off the transistors PA and PB and turning on the transistor ND and output control signals for turning off the transistors NA and NB and turning on the transistor PD. For this reason, for example, in the transistor PA, the source voltage is held at the ground potential GND, and the gate voltage is held at substantially the power supply voltage $V_{CC}$, so the inverse bias is supplied between the gate and the source, and the leakage current can be greatly reduced. In the same way, in the transistor NA, the source voltage is held at substantially the power supply voltage $V_{CC}$, and the gate voltage is held at the ground potential GND, so the inverse bias is supplied between the gate and the source, and the leakage current can be greatly reduced.

Further, in the present embodiment, the source voltage of the transistor NA is raised up to substantially the power supply voltage $V_{CC}$ by the pMOS transistor PD at the OFF time. On the other hand, in the charge pump circuit of the first embodiment, the source voltage of the transistor NA is raised by the nMOS transistor NC, so the source voltage is lowered from the power supply voltage $V_{CC}$ by exactly the amount of the threshold voltage of the transistor NC. For this reason, in the charge pump circuit of the present embodiment, at the OFF time, the source voltage of the transistor NA can be held relatively higher than that in the charge pump circuit of the first embodiment, so the effect of suppressing the leakage current is improved.

Further, in the present embodiment, when switching the output of the charge current $I_{UP}$ and the discharge current $I_{DN}$ in accordance with the up signal UP and the down signal DN, by using the control signal generation circuits 10A and 20A to appropriately generate the control signals at the predetermined timings, the transistors PA and ND simultaneously becoming on is avoided, the release of charge from the output terminal OUT can be prevented, the transistors NA and PD simultaneously becoming on is avoided, and the injection of charge into the output terminal OUT can be prevented. For this reason, the fluctuation of the voltage level of the control signal of the VCO due to the switching can be suppressed, and the fluctuation of the oscillation frequency of the VCO can be suppressed.

Third Embodiment

Figure 7:
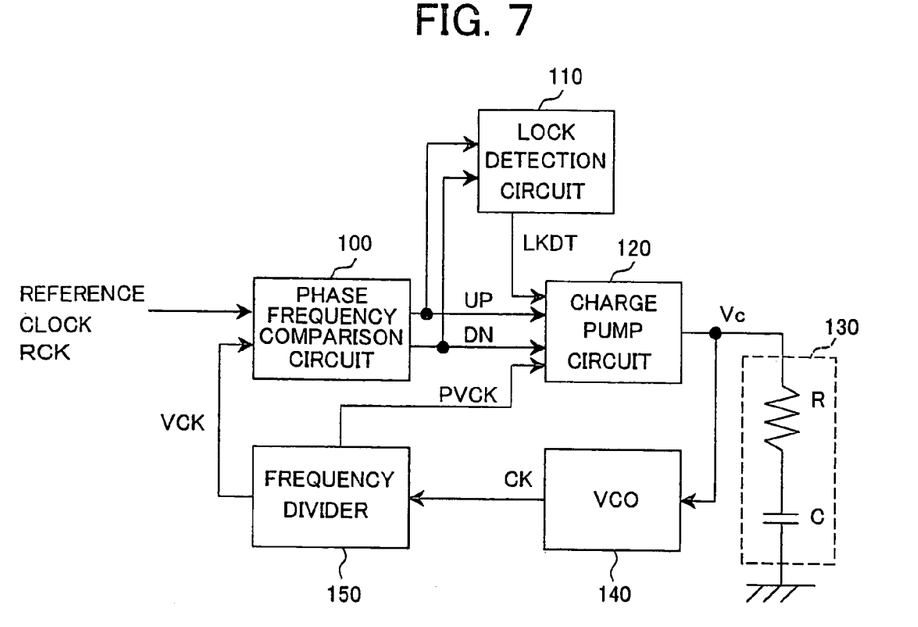
FIG. 7 is a block diagram of an example of the configuration of a PLL circuit according to the present invention.

FIG. 7 is a view of the configuration of an embodiment of a PLL circuit according to the present invention.

As illustrated, the PLL circuit of the present embodiment comprises a phase frequency comparison circuit 100, a lock detection circuit 110, a charge pump circuit 120, a loop filter 130, a VCO 140, and a frequency divider 150.

Below, an explanation will be given of the components of the PLL circuit of the present embodiment.

The phase frequency comparison circuit 100 compares the phases and frequencies of a reference clock signal RCK and the frequency divided clock signal VCK output from the frequency divider 150 and, as a result of the comparison, outputs the up signal UP or the down signal DN in accordance with the phase difference between the reference clock signal RCK and the frequency divided clock signal VCK.

The lock detection circuit 110 detects whether or not the PLL circuit is in the locked state in accordance with the up signal UP and the down signal DN from the phase frequency comparison circuit 100. As a result of the detection, when the PLL circuit is in the locked state, it activates the lock detection signal LKDT and, for example, sets it at the high level. Note that the lock detection signal LKDT is output to the charge pump circuit 120.

The charge pump circuit 120 outputs the charge current $I_{UP}$ or the discharge current $I_{DN}$ in accordance with the up signal UP or the down signal DN from the phase frequency comparison circuit 100 and the lock detection signal LKDT from the lock detection circuit 110.

The charge pump circuit 120 is configured by charge pump circuits of the first or second embodiments of the present invention explained above.

The loop filter 130 is configured by, as shown in FIG. 7, for example, a resistor R and a capacitor C cascade connected between the output terminal of the charge pump circuit and the ground potential GND. In the loop filter 130, the capacitor C charges or discharges in accordance with the charge current $I_{UP}$ and the discharge current $I_{DN}$ output from the charge pump circuit 120, generates a control voltage $V_C$, and outputs this to the VCO 140.

Note that FIG. 7 shows only an example of the configuration of the loop filter. The loop filter has other various configurations. A low pass filter including a resistor R and a capacitor C, however is the basic configuration. A common point is that the capacitor C charges or discharges in accordance with the output current of the charge pump circuit 120 to generate the control voltage $V_C$, and the oscillation frequency of the VCO 140 is controlled based on this.

The VCO 140 is controlled in its oscillation frequency in accordance with the control voltage $V_C$ generated by the loop filter 130. The VCO 140 generates the clock signal CK by the oscillation frequency and supplies this to the frequency divider 150.

The frequency divider 150 divides the clock signal CK from the VCO 140 by the predetermined frequency division ratio N and outputs the divided clock signal VCK to the phase frequency comparison circuit 100. Further, the frequency divider 150 generates the preliminary frequency divided clock signal PVCK having a phase slightly advanced from that of the frequency divided clock signal VCK and supplies this to the charge pump circuit 120.

The preliminary frequency divided clock signal PVCK is a pulse signal having, for example, a phase advanced from the frequency divided clock signal VCK by exactly one cycle's worth of the clock signal CK. For example, when the frequency division ratio of the frequency divider 150 is N, the preliminary frequency divided clock signal PVCK is advanced in its phase from the frequency divided clock signal VCK by exactly n/N.

Next, an explanation will be given of the operation of the PLL circuit having the above configuration.

In the phase frequency comparison circuit 100, by comparing the phases and frequencies of the reference clock signal RCK and the frequency divided clock signal VCK, the up signal UP or the down signal DN is output in accordance with the phase difference of these clock signals.

The lock detection circuit 110 decides whether or not the PLL circuit is in the locked state in accordance with the up signal UP or the down signal DN output by the phase frequency comparison circuit 100. As a result of the decision, when the PLL circuit is in the locked state, the lock detection signal LKDT is activated.

The charge pump circuit 120 outputs the charge current $I_{UP}$ or the discharge current $I_{DN}$ in accordance with the up signal UP or the down signal DN.

In the PLL circuit of the present embodiment, as a result of the detection by the lock detection circuit 110, when the PLL circuit is in the locked state, the charge pump circuit 120 switches the transistors in accordance with the control signal generated by the control signal generation circuit in accordance with the preliminary frequency divided clock signal PVCK and the up signal UP or down signal DN, as shown in the waveform diagrams of FIGS. 3A to 3I and FIGS. 5A to 5I. As a result, the leakage current at the OFF time when the up signal UP and the down signal DN are not output is reduced. Further, the level fluctuation of the control voltage $V_C$ at the OFF time is suppressed, and the fluctuation of the oscillation frequency of the VCO 140 is suppressed.

On the other hand, when the PLL circuit does not reach the locked state, the charge pump circuit 120 does not output the control signal $S1_C$ or $S2_C$. In this case, for example, in the charge pump circuit shown in FIG. 1, the transistors PC and NC are held in the off state, the transistors PA and PB and the transistors NA and NB are controlled in the on or off state in accordance with the up signal UP or the down signal DN, and the charge current $I_{UP}$ or the discharge current $I_{DN}$ is supplied to the output terminal OUT. In accordance with this, the loop filter 130 generates the control voltage $V_C$ in accordance with the output current of the charge pump circuit 120, the VCO 140 controls the oscillation frequency in accordance with this, and then the PLL circuit enters into the locked state when the phases and frequencies of the frequency divided clock signal VCK from the frequency divider 150 and the reference clock signal RCK substantially coincide.

As explained above, according to the PLL circuit of the present embodiment, when it has not reached the locked state, the charge pump circuit 120 generates the charge current $I_{UP}$ or the discharge current $I_{DN}$ in accordance with the up signal UP or the down signal DN from the phase frequency comparison circuit 100. In accordance with this, the loop filter 130 outputs the control voltage $V_C$, and the oscillation frequency of the VCO 140 is controlled. For this reason, feedback control is carried out in the PLL circuit so that a phase difference and the difference of the frequency between the frequency divided clock signal VCK output from the frequency divider 150 and the reference clock signal RCK are converged, and control is stabilized when the PLL circuit reaches the locked state. Then, after reaching the locked state, the charge pump circuit 120 operates as shown in FIGS. 3A to 3I and FIGS. 5A to 5I, the generation of the leakage current at the OFF time is suppressed, and the stability of the control voltage $V_C$ and the stability of the oscillation frequency of the VCO 140 can be enhanced. Further, the pulse width of the charge current $I_{UP}$ and the discharge current $I_{DN}$ can be controlled, and it is possible to control the oscillation frequency of the VCO 140 with a high precision.

Summarizing the effects of the invention, as explained above, according to charge pump circuit of the present invention and the PLL circuit configured by using the same, at the OFF time when the up signal and the down signal are not output, by supplying an inverse bias voltage between the source and the gate of the current output use transistor, the leakage current at the OFF time can be reduced, and the stability of the oscillation frequency of the VCO can be enhanced. On the other hand, when switching the current output transistor in accordance with the up signal and the down signal, by appropriately controlling the switching timing of the transistors, the injection or release of the charge of the charge pump circuit output terminal due to the switching can be prevented, the fluctuation of the control voltage is suppressed, and the fluctuation of the oscillation frequency of the VCO can be suppressed.

Further, according to the charge pump circuit of the present invention, the timing of the current output is controlled according to the lock signal supplied to the control terminal of the current output use transistor, so the rising or falling edge of the output current can be made sharper, the width of the current pulse can be made narrower, and the oscillation frequency of the VCO can be controlled with a high precision according to this.

While the invention has been described with reference to specific embodiments chosen for purpose of illustration, it should be apparent that numerous modifications could be made thereto by those skilled in the art without departing from the basic concept and scope of the invention.

What it claimed is:

1. A charge pump circuit for outputting a current in an effective period in accordance with an input signal held at a first level in said effective period and held at a second level in a period other than said effective period, comprising:

first and second transistors connected in series between a first power supply terminal and an output terminal of the charge pump circuit;

a third transistor connected between a connection point of said first and second transistors and a second power supply terminal; and a control signal generation circuit, wherein said control signal generation circuit:

generates a first control signal for turning said first transistor on in said effective period and for turning off said first transistor other than this in accordance with said input signal and supplying the first control signal to the control terminal of said first transistor, generates a second control signal for turning said second transistor on before said first transistor is turned on, turning off said second transistor after said first transistor is turned off, holding a level where a desired output current flows when said second transistor is on, and supplying the second control signal to the control terminal of said second transistor, and generates a third control signal for turning off said third transistor before said second transistor is turned on, turning on said third transistor after said second transistor is turned off, and supplying the third control signal to the control terminal of said third transistor, and wherein said first, second and third control signals are generated by said control generation circuit in accordance with a preliminary input signal having a phase advanced from said input signal.

2. A charge pump circuit as set forth in claim 1, wherein said control signal generation circuit has a buffer for delaying said input signal by exactly a predetermined delay time and a logic gate for performing a logic operation in accordance with said input signal and an output signal of said buffer; and said first control signal is generated in accordance with the output signal of said buffer and said second control signal is generated in accordance with the output signal of said logic gate.

3. A charge pump circuit as set forth in claim 2, wherein said control signal generation circuit switches the level of said third control signal in accordance with said preliminary input signal, turns off said third transistor, switches the level of said third control signal in accordance with said second control signal, and turns said third transistor on.

4. A charge pump circuit as set forth in claim 1, wherein an inverse bias voltage is supplied between a gate and a source of said second transistor.

* * * * *